(12) United States Patent
Frye et al.

(10) Patent No.: US 10,842,039 B1
(45) Date of Patent: Nov. 17, 2020

(54) MECHANICAL BYPASS SWITCH ASSEMBLY FOR A BACKPLANE

(71) Applicant: Phoenix Contact Development and Manufacturing, Inc., Middletown, PA (US)

(72) Inventors: Scott Michael Frye, Palmyra, PA (US); Brian John Gillespie, Jr., Hummelstown, PA (US); Christopher Michael Brink, Middletown, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 16/645,606

(22) PCT Filed: Sep. 17, 2018

(86) PCT No.: PCT/US2018/051286
§ 371 (c)(1),
(2) Date: Mar. 9, 2020

(87) PCT Pub. No.: WO2020/060527
PCT Pub. Date: Mar. 26, 2020

(51) Int. Cl.
*H05K 7/14* (2006.01)
*H04L 12/24* (2006.01)

(52) U.S. Cl.
CPC ........... *H05K 7/1477* (2013.01); *H04L 41/12* (2013.01)

(58) Field of Classification Search
CPC .............................. H05K 7/1477; H04L 41/12
See application file for complete search history.

(56) References Cited

U.S. PATENT DOCUMENTS

| | | | |
|---|---|---|---|
| 6,895,447 B2 * | 5/2005 | Brewer | G06F 13/385 710/11 |
| 7,612,631 B2 * | 11/2009 | Hsu | G06F 13/409 326/30 |
| 7,894,336 B2 | 2/2011 | Monce et al. | |
| 9,795,046 B2 * | 10/2017 | Bury | H05K 7/1477 |
| 10,739,745 B1 * | 8/2020 | Kretschmann | H05K 7/1464 |
| 2007/0061056 A1 | 3/2007 | Valsorda | |
| 2008/0059685 A1 * | 3/2008 | Hsu | H05K 1/0295 710/314 |

(Continued)

FOREIGN PATENT DOCUMENTS

| | | |
|---|---|---|
| EP | 2367299 B1 | 6/2016 |
| EP | 3040794 A1 | 6/2016 |
| RU | 2406195 C2 | 12/2010 |

OTHER PUBLICATIONS

Machine language translation of specification of RU2406195C2.

(Continued)

*Primary Examiner* — Nathan Milakovich
(74) *Attorney, Agent, or Firm* — Hooker & Habib, P.C.

(57) ABSTRACT

A backplane or backplane module for transmitting data along a signal path of a network to one or more functional modules attached to the signal path includes a printed circuit board, a functional module electrical connector attached to the printed circuit board, and a mechanically actuated bypass circuit assembly that maintains signal continuity along the signal path when a function module is not attached to the function module electrical connector.

28 Claims, 19 Drawing Sheets

(56) References Cited

U.S. PATENT DOCUMENTS

2010/0012365 A1* 1/2010 Hsieh .................. H05K 1/0295
174/261
2011/0145433 A1 6/2011 Noel et al.

OTHER PUBLICATIONS

Machine language translation of claims of RU2406195C2.
European Patent Office, International Search Report in corresponding PCT/US18/51286, dated May 21, 2019, 10 pages.

* cited by examiner

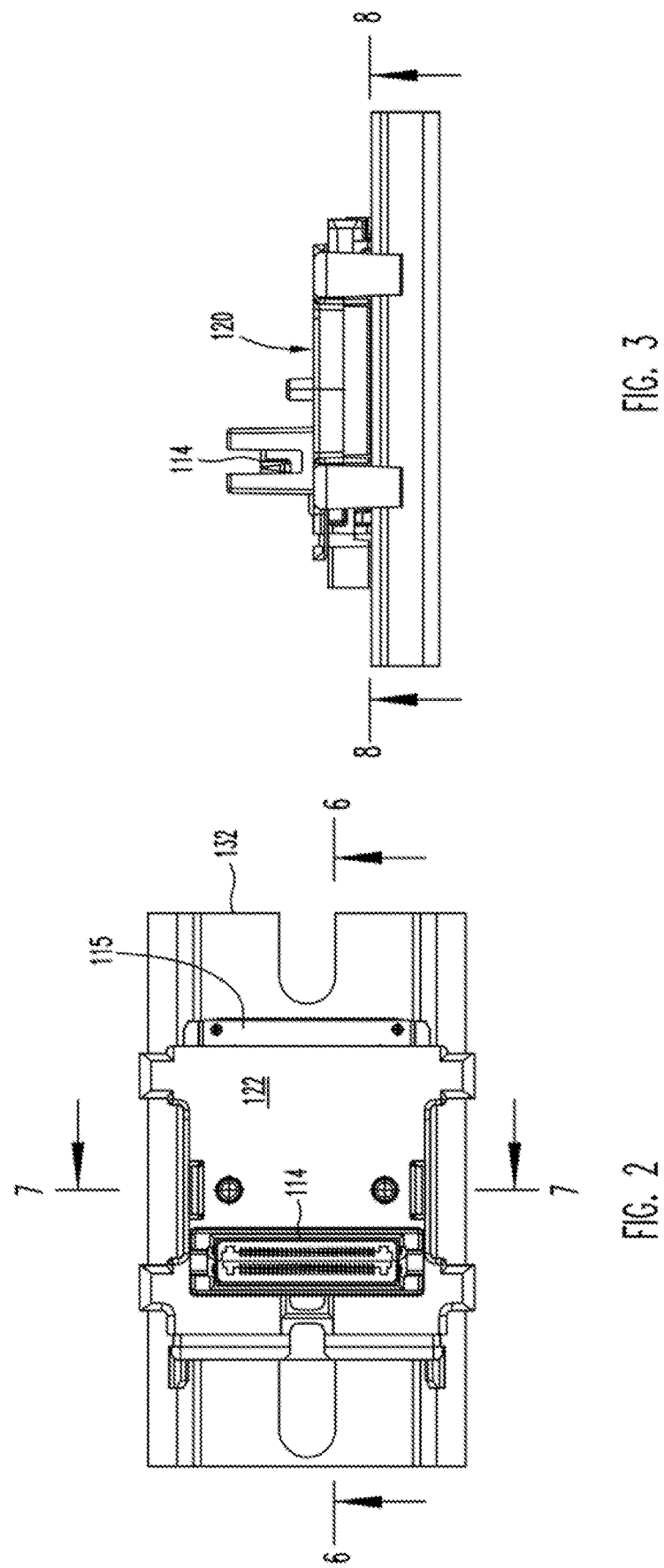

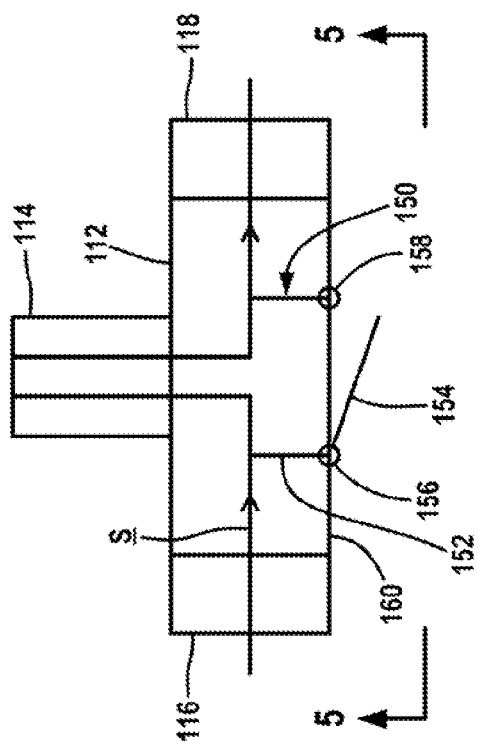
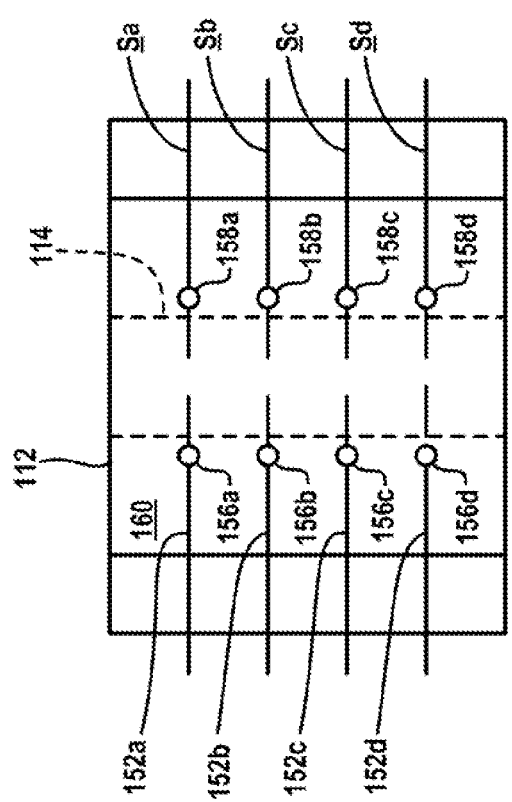

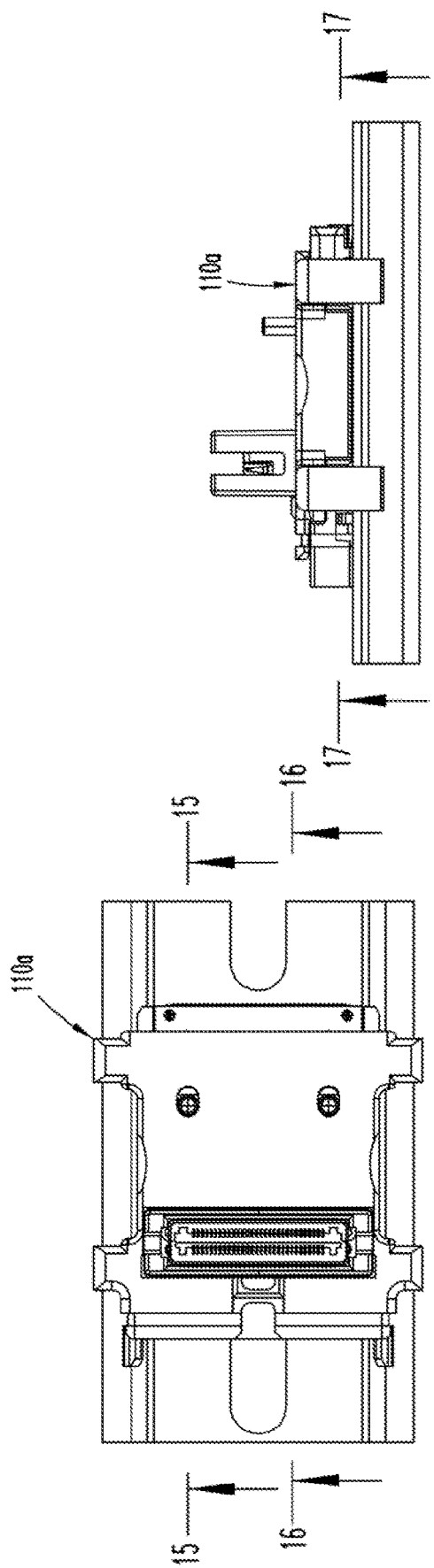

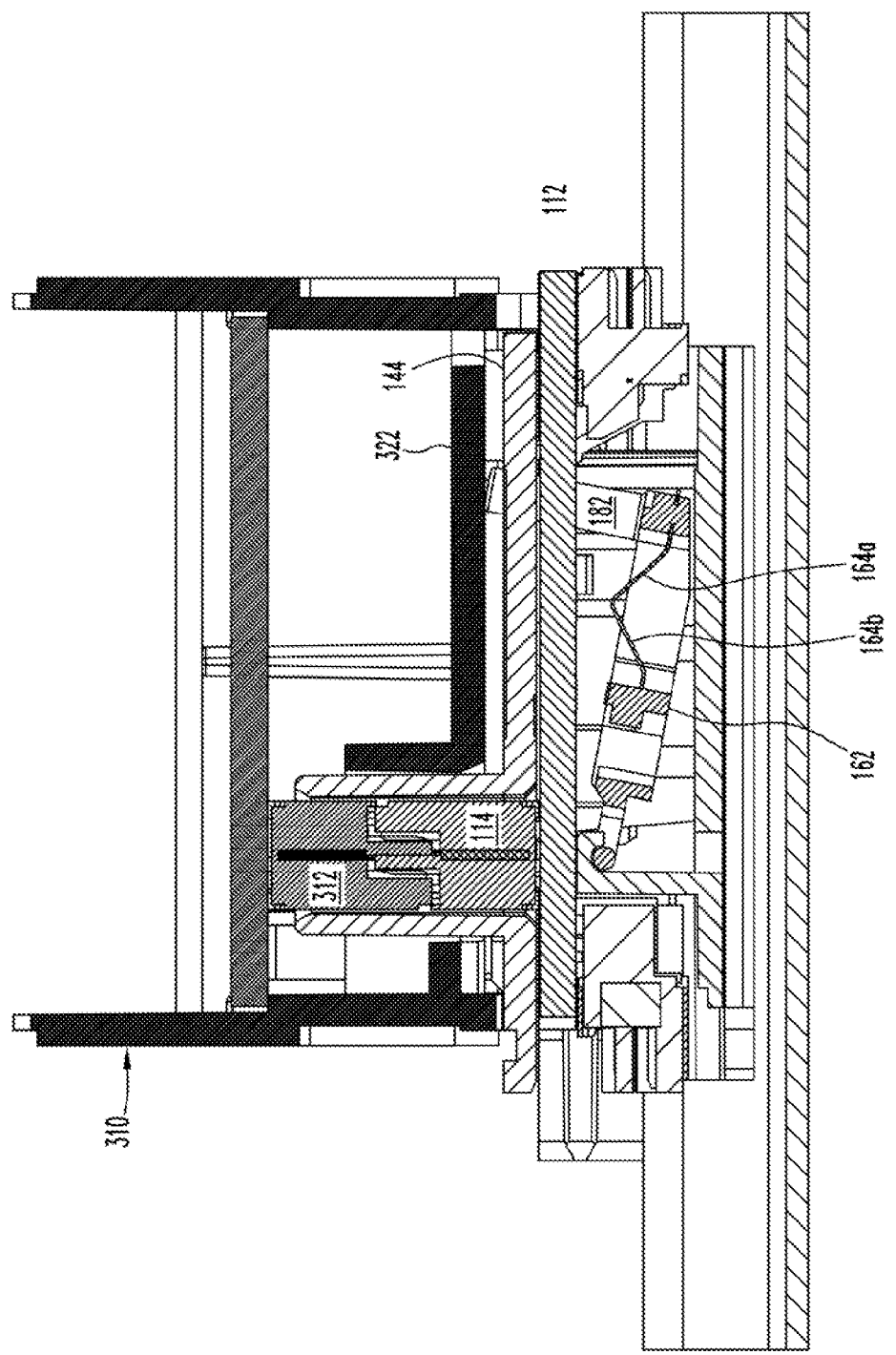

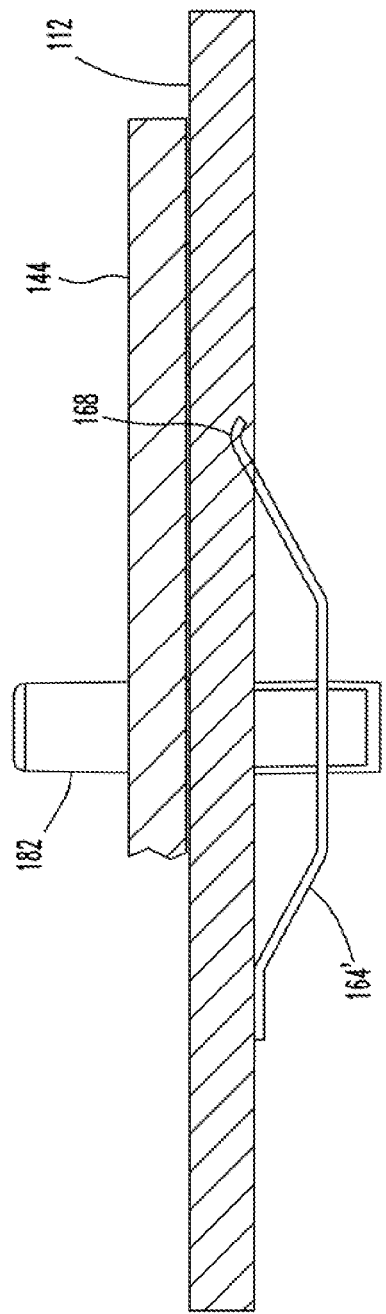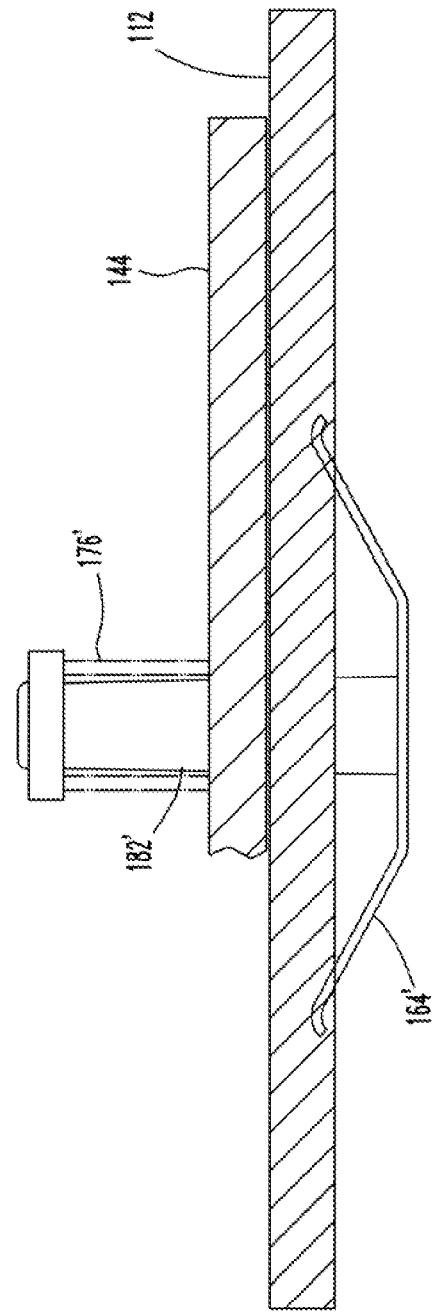

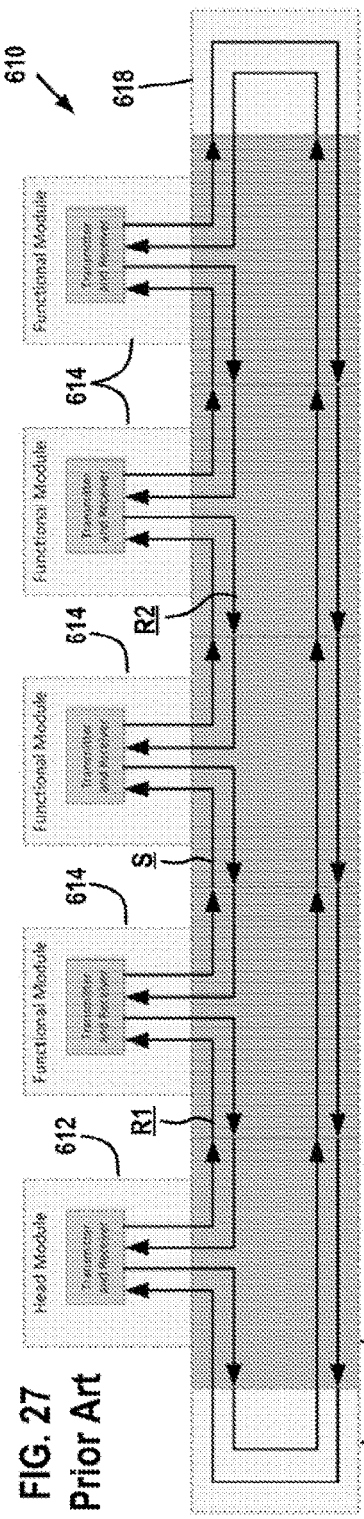
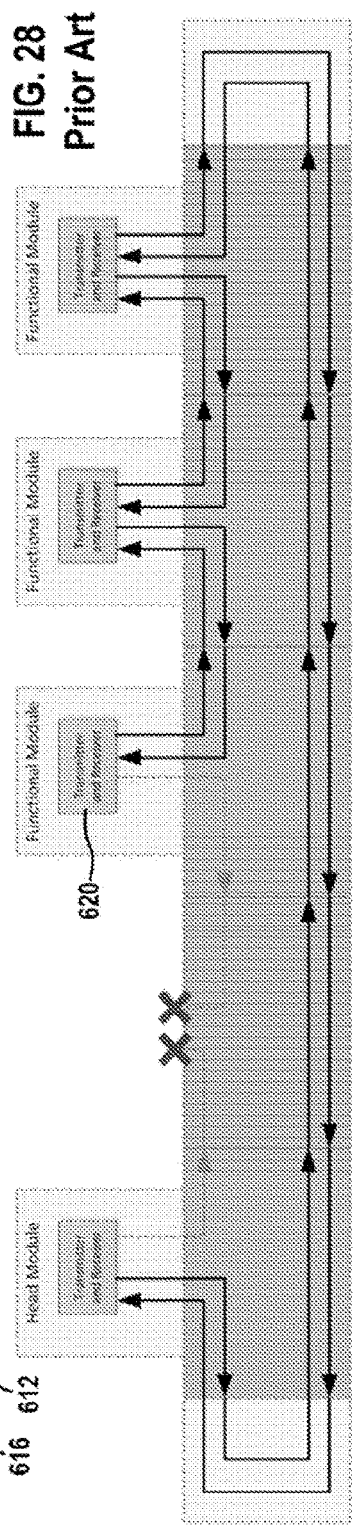
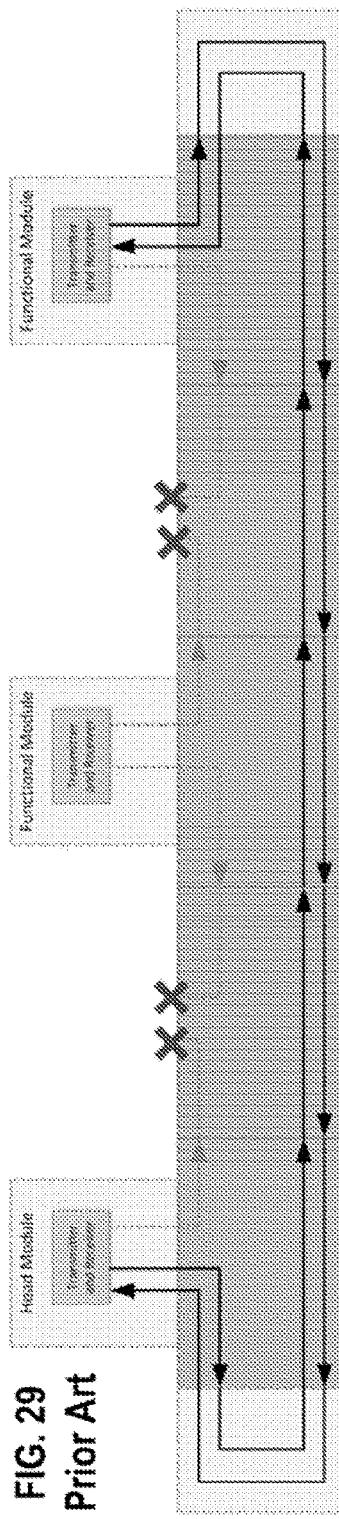
FIG. 27 Prior Art
FIG. 28 Prior Art
FIG. 29 Prior Art

MECHANICAL BYPASS SWITCH ASSEMBLY FOR A BACKPLANE

FIELD OF THE DISCLOSURE

The disclosure relates generally to networks utilizing a backplane that provides an electrically conductive signal path through a number of electrical connectors attached to the backplane.

BACKGROUND OF THE DISCLOSURE

Industrial control networks often utilize an electrically conductive signal path that transmits data, power, or both power and data signals along a network. The signal path may be arranged in different network topologies, including a bus network topology (in which the signal path extends along a linear or branched path) or a ring network topology (in which the signal path extends along a closed loop). In some ring networks the signal path includes two rings that can independently carry the signal and provide redundancy in the event of a break in the signal path.

Signal paths may be formed on a backplane that carries and connects multiple function modules to the network. A function module may process data read from the network, may write data to the network, or may perform other tasks.

The signal path extends through the function modules attached to the backplane. An active function module is capable of reading and/or writing data from or to the signal path. A passive function module merely passes the signal path through the function module to maintain signal path continuity without reading or writing data.

The backplane may be a monolithic backplane formed from a single printed circuit board. The printed circuit board may connect multiple function modules to the signal path. Alternatively the backplane may be formed from a number of backplane modules, each module including a printed circuit board. Left and right electrical connectors on the sides of each printed circuit board interconnect the backplane modules and enable the size of the backplane formed by the backplane modules to vary in use.

The signal path on a printed circuit board may in some networks consist of a single electrically conductive path that corresponds to transmitting the signal along a single wire. The signal path on a printed circuit board may in other networks consist of multiple electrically conductive paths that correspond to transmitting the signal along the wires of a multi-wire cable, each conductive path corresponding to a different wire. For example, the signal path of an Ethernet based industrial control network may be formed as four electrically conductive paths corresponding to the wires of a 4-wire Ethernet cable.

The printed circuit board of a monolithic backplane may carry multiple function module electrical connectors that removably mount the function modules to the printed circuit board. The printed circuit boards of modular backplanes typically carry a single function module electrical connector.

A function module electrical connector includes an electrically conductive signal path that is connected to the signal path of the printed circuit board. The signal path through the function module electrical connector is normally open if a function module is not attached to the function module electrical connector. The function module includes an electrical connector that mates with the function module electrical connector and closes the signal path to enable the signal path to extend through the function module.

As illustrated below, the signal path break at the function module electrical connector which has a function module removed can prevent data transmission to other function modules on the network.

FIG. 24 illustrates a portion of an industrial control network 510 utilizing a monolithic backplane 512 formed from a single printed circuit board and a number of like function module electrical connectors 514 attached to the backplane. Each function module electrical connector is intended to receive a respective function module 516 that is electrically and at least partially mechanically connected to the backplane through the connector.

FIG. 24 illustrates the backplane 512, function module electrical connectors 514, and function modules 516 transmitting an Ethernet signal path S along a portion of an industrial control network configured as a bus topology. Data passes in series through each function module, and then out from the backplane. The backplane may form part of a signal path for a larger network topology.

The signal path S includes four parallel electrically conductive paths, the paths corresponding to the wires of a 4-wire Ethernet cable.

If a function module 516 is removed from a function module electrical connector 514, communication of the Ethernet signal stream with downstream function modules is broken by an open circuit in the signal path at the function module electrical connector. See FIG. 25 in which a function module has been removed from a connector. The signal break is indicated by the "X" in the figure.

To enable communication with downstream function modules 516 even if a function module is removed from a function module electrical connector 514, it is known to place software-controlled bypass switch assemblies 520 in the signal path. See FIG. 26. Each bypass switch assembly is associated with a respective function module electrical connector. A bypass switch assembly includes a signal bypass circuit 522 wired in the signal path in parallel with the signal path of the function module electrical connector, and a bypass switch 524 in the bypass circuit that selectively opens and closes the signal bypass circuit.

As seen in FIG. 26, the bypass switch 524 associated with a functional module electrical connector is closed if there is no function module attached to the function module electrical connector. The normally closed switch enables the signal path S to bypass the open function module electrical connector 514 and continue downstream past the open connector.

The bypass switch 524 is open when there is a function module attached to the function module electrical connector. The signal path S extends through the function module electrical connector and through the function module 516 attached to the connector.

Bypass switches for backplanes conveying network signals are conventionally formed as electrical devices that open or close under software control. See, for example, Monse et al. U.S. Pat. No. 7,894,336 and Noel et al. US Patent Application Publication 2011/0145433.

There is a need for reliability and performance reasons, however, for a purely mechanical bypass switch assembly for use in networks utilizing a backplane that provides a signal path between a number of functional module electrical connectors attached to the backplane. The mechanical bypass switch assembly should automatically close the bypass switch if a function module is removed from the function module electrical connector, and should automatically open the bypass switch when a function module is operatively connected to the function module electrical connector. The mechanical bypass switch assembly should be usable with different network topologies and with signal paths having different numbers of conductive paths.

SUMMARY OF THE DISCLOSURE

Disclosed is a purely mechanical bypass switch assembly for use in networks utilizing a backplane that provides a signal path through a number of functional module electrical connectors attached to the backplane. The mechanical bypass switch assembly automatically closes the bypass switch if a function module is removed from the function module electrical connector, and automatically opens the bypass switch when a function module is connected to the function module electrical connector. The mechanical bypass switch assembly is usable with different network topologies and with signal paths having different numbers of conductive paths.

A backplane or backplane module utilizing the mechanical bypass switch assembly includes a printed circuit board, a function module electrical connector capable of being removably connected to a function module for making electrical connections therebetween, and a bypass circuit assembly. The printed circuit board has a first side, an opposite second side, and an electrically conductive network signal path.

The function module electrical connector is attached to the first side of the printed circuit board and includes an electrically conductive signal path in series with the network signal path of the printed circuit board. The network signal path has an open portion between first and second portions of the network signal path when no function module is connected to the function module electrical connector.

The bypass circuit assembly includes a bypass circuit, a mechanically actuated bypass circuit switch, and an actuator. The bypass circuit forms a portion of the printed circuit board and includes an electrically conductive bypass signal path and first and second sets of electrical terminals. The bypass signal path is connected in series between the first and second portions of the network signal path, with the bypass signal path extending in parallel across the open portion of the network signal path. The bypass signal path includes a first portion connected to the first portion of the network signal path, a second portion connected to the second portion of the network signal path, and an open portion between the first and second portions of the bypass signal path.

The first portion of the bypass signal path includes the first set of electrical terminals and the second portion of the bypass signal path includes the second set of electrical terminals. The first and second sets of electrical terminals are not in electrical continuity with one another and are located on the second side of the printed circuit board.

The electrical contact is on the second side of the printed circuit board and is movable with respect to the printed circuit board between spaced-apart closed and opened positions. The electrical contact engages the first and second sets of electrical terminals of the bypass circuit and thereby closes the bypass signal path when the electrical contact is in the closed position. The electrical contact is spaced apart from and does not engage the first and second sets of electrical terminals of the bypass circuit when the electrical contact is in the opened position.

The actuator is connected to the electrical contact and is conjointly movable with the electrical contact. The actuator extends from the second side of the printed circuit board and through the printed circuit board to a free end of the actuator located on the first side of the printed circuit board and spaced away from the printed circuit board when the electrical contact is in the closed position. A force applied to the free end of the actuator when the electrical contact is in the closed position urging the free end of the actuator towards the printed circuit board also urges the electrical contact towards the opened position of the electrical contact.

In embodiments of the disclosed bypass circuit switch assembly the bypass switch includes a number of electrical contacts that open and close respective conductive paths of the network signal path. The network signal path for example may have four conductive paths corresponding to the four wires of a standard four-wire Ethernet cable that form part of a bus network topology or a ring network topology.

In yet other embodiments of the disclosed bypass switch assembly the switch assembly may be located in a housing that also houses the printed circuit board and attaches the printed circuit board and the bypass switch assembly to a DIN rail.

In embodiments of the disclosed bypass switch assembly the electrical contact is held by a contact holder. The contact holder is urged by a spring towards the closed position of the electrical contact, causing the bypass switch to be a normally closed switch. In yet other embodiments of the disclosed bypass switch assembly the contact holder holds two or more electrical contacts.

Other objects and features of the disclosure will become apparent as the description proceeds, especially when taken in conjunction with the accompanying drawing sheets illustrating one or more illustrative embodiments.

BRIEF DESCRIPTIONS OF THE DRAWINGS

FIG. 2 is a top view of the backplane module shown in FIG. 1.

FIG. 3 is a side view of the backplane module shown in FIG. 1.

FIG. 4 is a schematic side view of the signal path and mechanical bypass switch assembly of the backplane module shown in FIG. 1.

FIG. 5 is a schematic view taken along lines 5-5 of FIG. 4.

FIG. 13 is a top view of the backplane module shown in FIG. 12.

FIG. 14 is a side view of the backplane module shown in FIG. 12.

FIG. 20 is a sectional view taken along lines 20-20 of FIG. 19.

FIG. 22 is a side view of a second embodiment electrical contact having an end attached to the printed circuit board.

FIG. 23 is a side view of a third embodiment electrical contact having an integral actuator member.

FIGS. 27-29 are schematic views of a prior art backplane defining a portion of a ring network topology.

DETAILED DESCRIPTION

Figure 1:
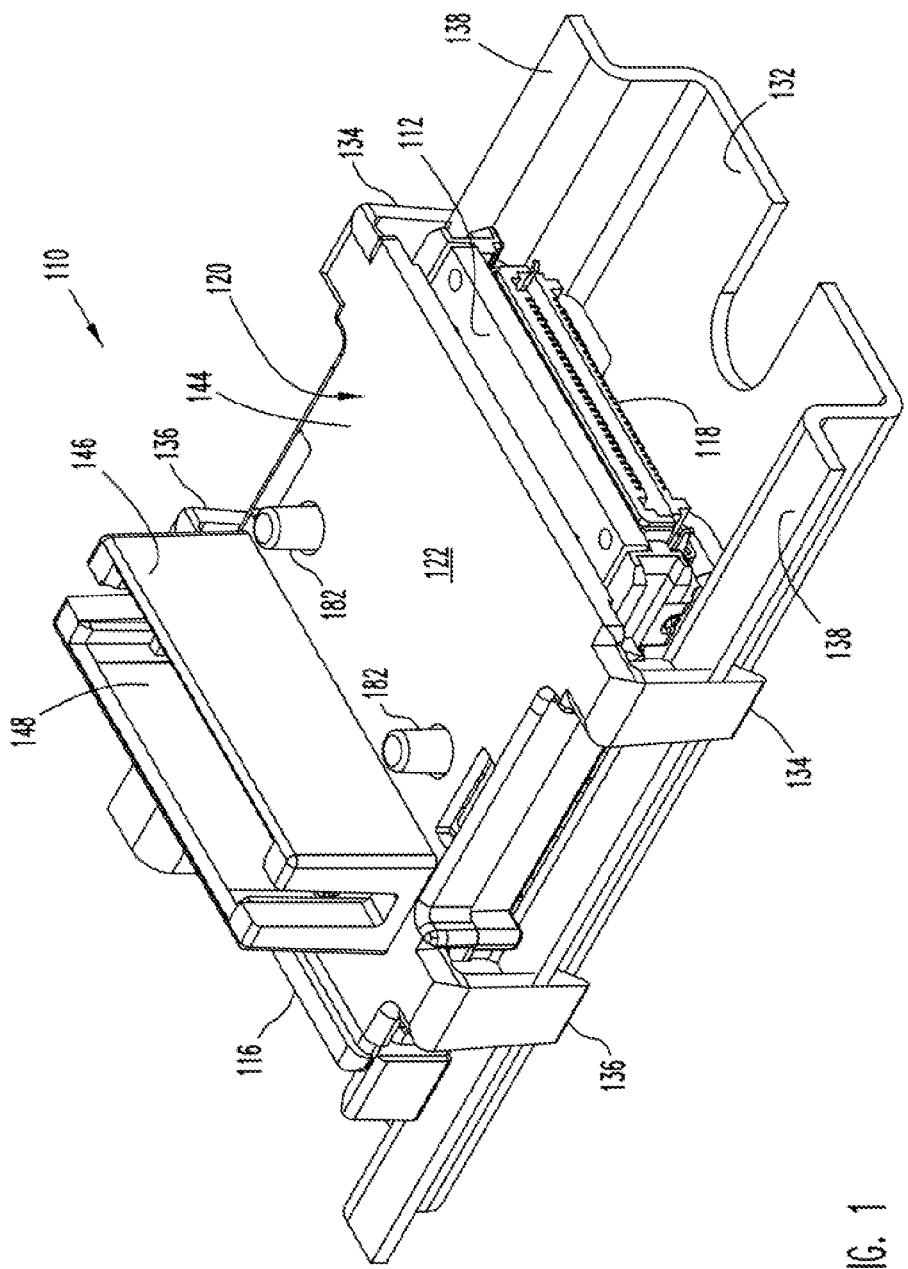
FIG. 1 is a perspective view of a backplane module having a first embodiment mechanical bypass switch assembly, the backplane module attached to a DIN rail.

FIGS. 1-8 illustrate a backplane module 110 used for forming a modular backplane of an Ethernet-based process control network. The backplane module includes a printed circuit board 112 that forms a portion of the backplane, and a function module electrical connector 114 for connecting a function module to the printed circuit board. The function module electrical connector is located on an upper side 115 of the printed circuit board.

A left electrical connector 116 and a right electrical connector 118 electrically connect the printed circuit board 112 to the printed circuit boards of adjacent left or right backplane modules. An Ethernet signal stream S (see FIG. 4) is communicated between one side of the printed circuit board 112 and the left electrical connector and is communicated between the other side of the printed circuit board and the right electrical connector. The signal stream S forms part of a bus network topology as shown in FIG. 22. A function module electrical connector 114 is disposed in the signal stream between the left and right electrical connectors.

The printed circuit board 112 is housed in a plastic housing 120. The housing includes a top cover 122, a bottom wall 124 and opposing pairs of side walls 126 integrally formed with the bottom wall. The housing cover and walls cooperatively define an interior volume of the housing. The housing top cover attaches to the housing side walls by housing latch arms 128, 130.

Figure 7:
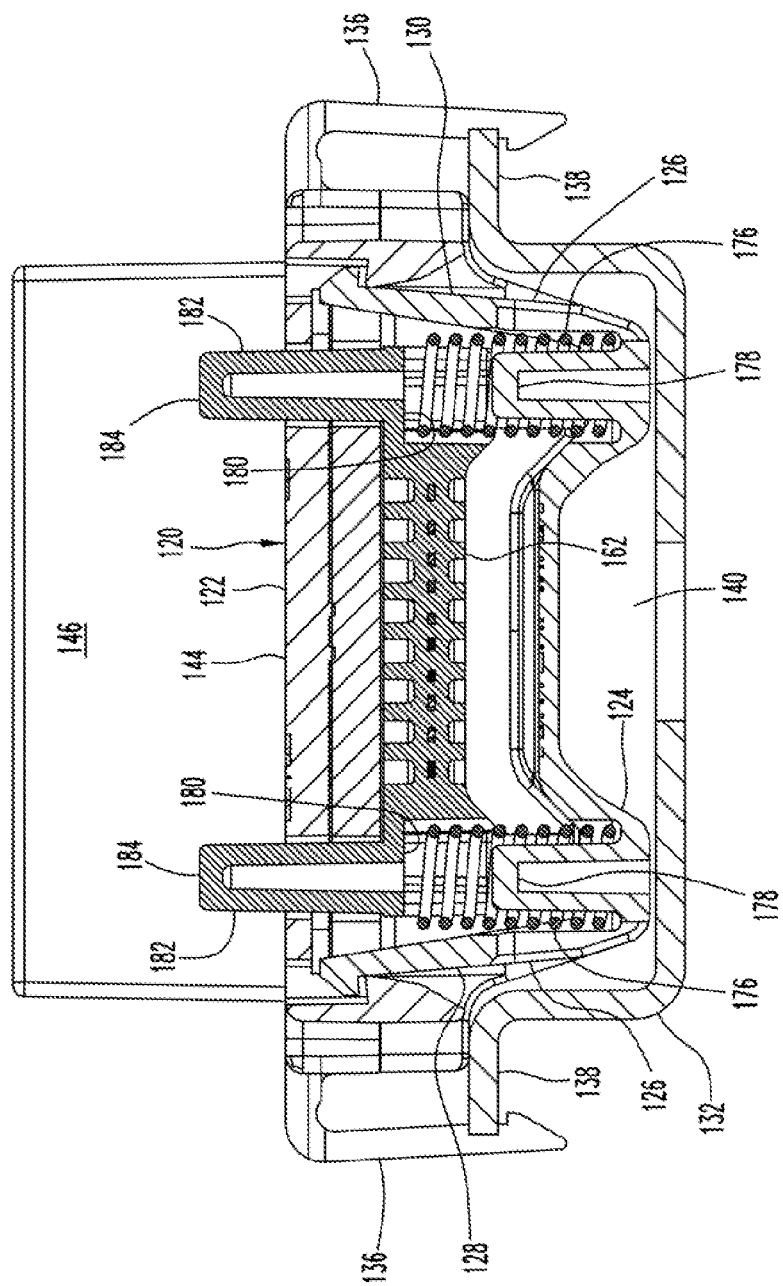
FIG. 7 is a sectional view taken along lines 7-7 of FIG. 2.

The illustrated backplane module 110 is shown mounted on a conventional DIN rail 132. Pairs of DIN rail mounting latches 134, 136 extend from opposite sides of the housing top cover 122 and attach the housing 120 to the flanges 138 of the DIN rail as best seen in FIG. 7. The printed circuit board 112 is located between the housing top cover and the DIN rail flanges. When the housing is attached to the DIN rail the housing side walls extend into the DIN rail recess 140 formed between the DIN rail flanges.

The housing top cover 122 is closely spaced above the upper surface 115 of the printed circuit board 112. The top cover includes a flat, planar portion 144 that overlays the printed circuit board and a function module electrical connector housing portion 146 that receives the function module electrical connector 114. The connector housing portion extends upwardly away from the printed circuit board beyond the electrical connector 114 and defines a receptacle 148 located above the electrical connector 114 that assists in guiding attachment of a function module with the electrical connector 114.

As shown schematically in FIGS. 4 and 5, the backplane module includes a bypass switch assembly 150 in the Ethernet signal stream S having a normally-open signal bypass circuit 152 and a mechanically-operated switch assembly 154 in the bypass circuit.

The bypass switch assembly 150 is operatively equivalent to the bypass switch assembly 520 shown in FIG. 23. That is, the bypass switch assembly 150 joins two respective ends of an open circuit portion of a bus topology.

The bypass circuit is formed on the printed circuit board 112 and includes a set of exposed contact terminals 156, 158 located at respective open ends of the bypass circuit. The contact terminals 156, 158 are located on the bottom side 160 of the printed circuit board from the function module electrical connector 114 and are disposed inside the housing 120. The mechanically operated switch assembly 154 is also located inside the housing and operates to open and close the bypass circuit.

The Ethernet signal stream S of the illustrated backplane module 110 includes conductive paths carried by the printed circuit board 112 corresponding to the four wires of a conventional four-wire Ethernet cable. The signal stream S is defined by the four conductive paths Sa, Sb, Sc, and Sd formed on the printed circuit board and corresponding to respective wires of the Ethernet cable. See FIG. 5.

The signal bypass circuit 152 is defined by the four normally open conductive paths 152a, 152b, 152c, 152d that each bypass a respective conductive path of the signal path S along a bus network or each interconnect corresponding conductive paths of the two rings R1 and R2.

The contact terminals 156, 158 are formed by respective sets of exposed contact terminals 156a-156d and 158a-158d located on the bottom side of the printed circuit board. The four pairs of contact terminals 156, 158 in the illustrated embodiment are formed as four pairs of contact pads (156a, 158a), (156b, 158b), (156c, 158c), and (156d, 158d) that are spaced apart transverse to the DIN rail axis. Each pair of pads 156, 158 are spaced apart parallel with the DIN rail axis as best seen in FIG. 8.

The mechanically operated switch assembly 154 includes four switches (described in more detail below), each switch associated with a respective pair of contact pads 156, 158 to open and close a respective conductive path 152.

Figure 6:
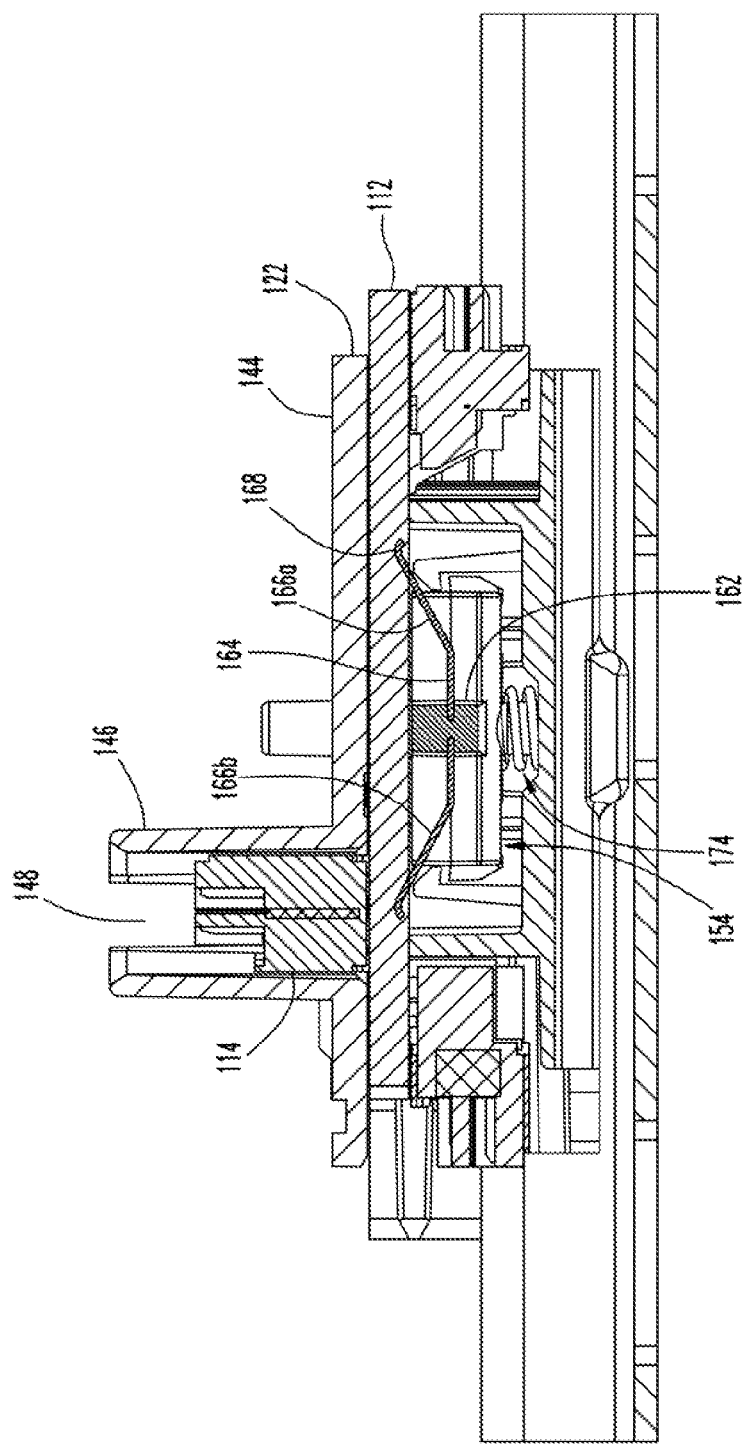
FIG. 6 is a sectional view taken along lines 6-6 of FIG. 2.
Figure 8:
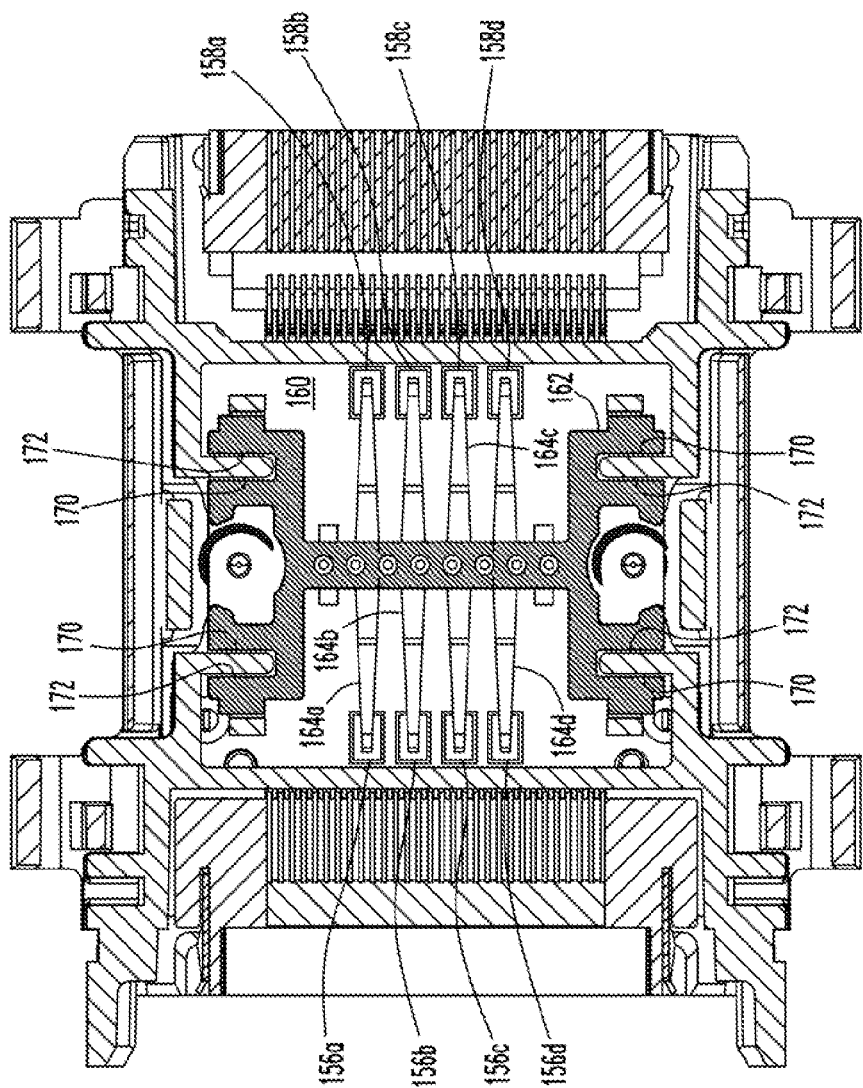
FIG. 8 is a sectional view taken along lines 8-8 of FIG. 3.

Construction of the switch assembly 154 is described next and is best seen in FIGS. 6-8. A contact holder 162 is disposed beneath the pairs of contact pads 156, 158. The contact holder is formed from an electrically insulating polymer. The contact holder carries four electrical contacts 164 formed as spaced apart, like spring contacts 164a, 164b, 164c, 164d. Each spring contact is associated with a respect pair of contact pads (156a, 158a), (156b, 158b), (156c, 158c), and (156d, 158d). Each spring contact includes a pair of bent spring arms 166a, 166b extending away from each other in opposite directions along the DIN rail axis. Each spring arm 166 includes a curved contact nose 168 that faces the respective contact pad on the printed circuit board.

The contact holder 162 is movably mounted in the housing 120 below the printed circuit board 112 for translation towards and away from the printed circuit board. Translation of the contact holder causes corresponding conjoint translation of the spring contacts 164 carried by the contact holder. The contact holder is moveable between a closed position shown in FIG. 6 and an opened position (seen best in FIG. 11). Pairs of interior planar guide walls 170 extend into the housing from the housing side walls and are closely received into corresponding narrow slots 172 formed on the ends of the contact holder.

When the contact holder 162 is in the closed position the contact holder is closest to the printed circuit board 112 with the contact noses 168 in contact with the corresponding contact pads 156 or contact pads 158. Each spring contact 164a, 164b, 164c, 164d thereby electrically connects the respective pairs of contact pads associated with the spring contact and thereby closes a respective signal bypass circuit 152.

The guide walls 170 and the contact holder slots 172 assist in resisting cocking or jamming of the contact holder 162 caused by the spring forces transmitted to the contact holder from the spring contacts while the contact holder is moving relative to the printed circuit board 120, and when the contact holder in its closed position.

The contact holder 162 moves away from the printed circuit board 112 when moving from the closed position to the opened position of the contact holder. When the contact holder is in the opened position the spring contacts 164 are spaced away from the contact pads 156, 158 and the contact noses 168 are spaced away from the contact pads by an air gap. The signal bypass 152 is opened and does not carry a bypass signal.

A spring assembly 174 is disposed inside the housing 120 that urges the contact holder 162 to the closed position. The spring assembly includes a pair of compression springs 176 mounted on elongate posts 178 defined by the bottom wall of the housing. The springs engage against flat lower abutment surfaces 180 of the contact holder. The compressed length and generated spring force of the springs 176 is defined by the distance between the abutment surfaces 180 and the housing lower wall 124.

The electrical contacts 164 are located between the springs.

A pair of actuators 182 are used in tandem to drive the contact holder 162 from the closed position to the opened position. The actuators are elongate members each integrally formed with the contact holder 162 that extend upwardly away from respective surfaces 180 of the contact member. See FIG. 7. The actuators extend freely through corresponding aligned through holes formed in and extending through the printed circuit board 112 and the housing top cover planar portion 144. The actuators are spaced a uniform distance from and relatively close to the side of the function module electrical connector housing portion 146 facing the right electrical connector 118.

The actuators 182 extend out of the housing 120 to flat, generally co-planar upper end surfaces 184 that are generally parallel with the flat cover portion 144.

Figure 10:
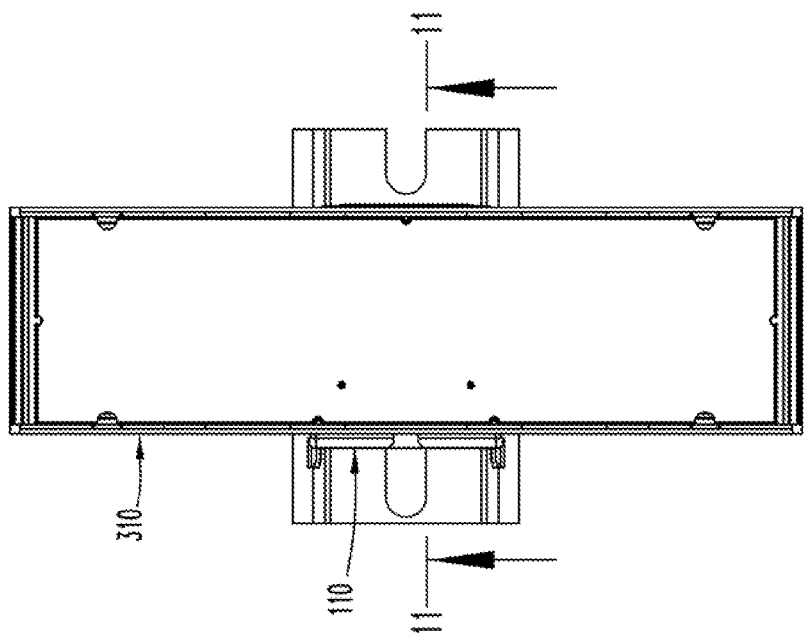
FIG. 10 is similar to FIG. 2 but with a function module attached to the backplane module.
Figure 9:
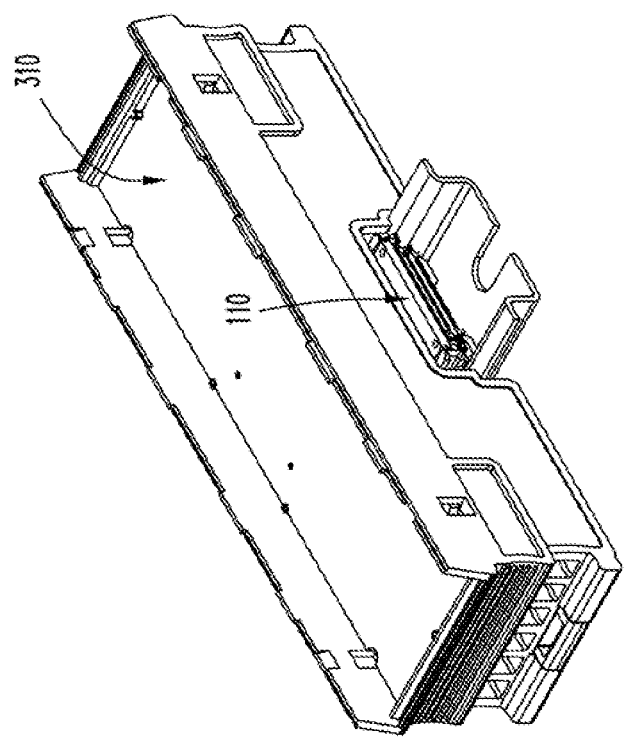
FIG. 9 is similar to FIG. 1 but with a function module attached to the backplane module.
Figure 11:
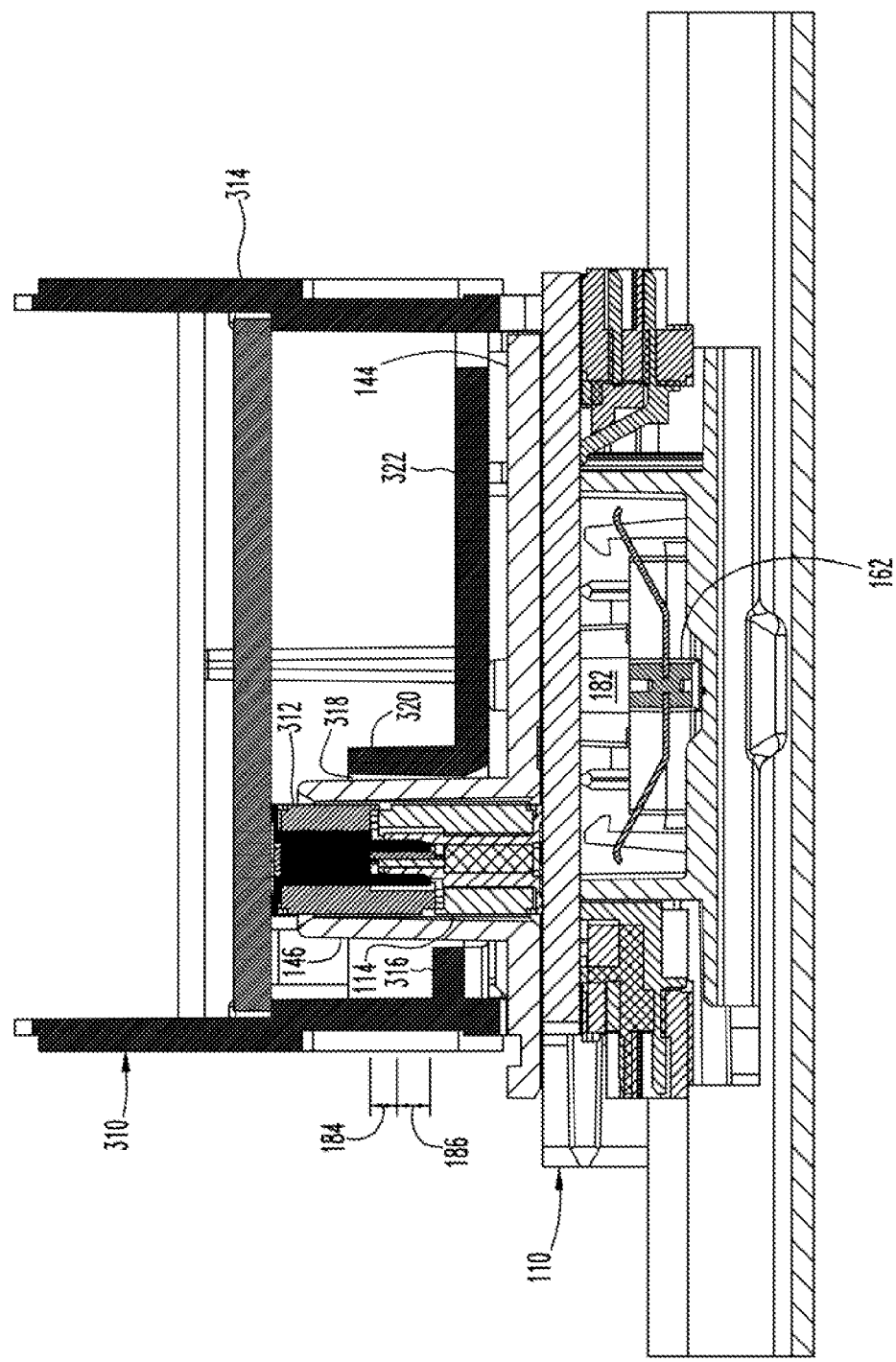
FIG. 11 is a sectional view taken along lines 11-11 of FIG. 10.
Figure 12:
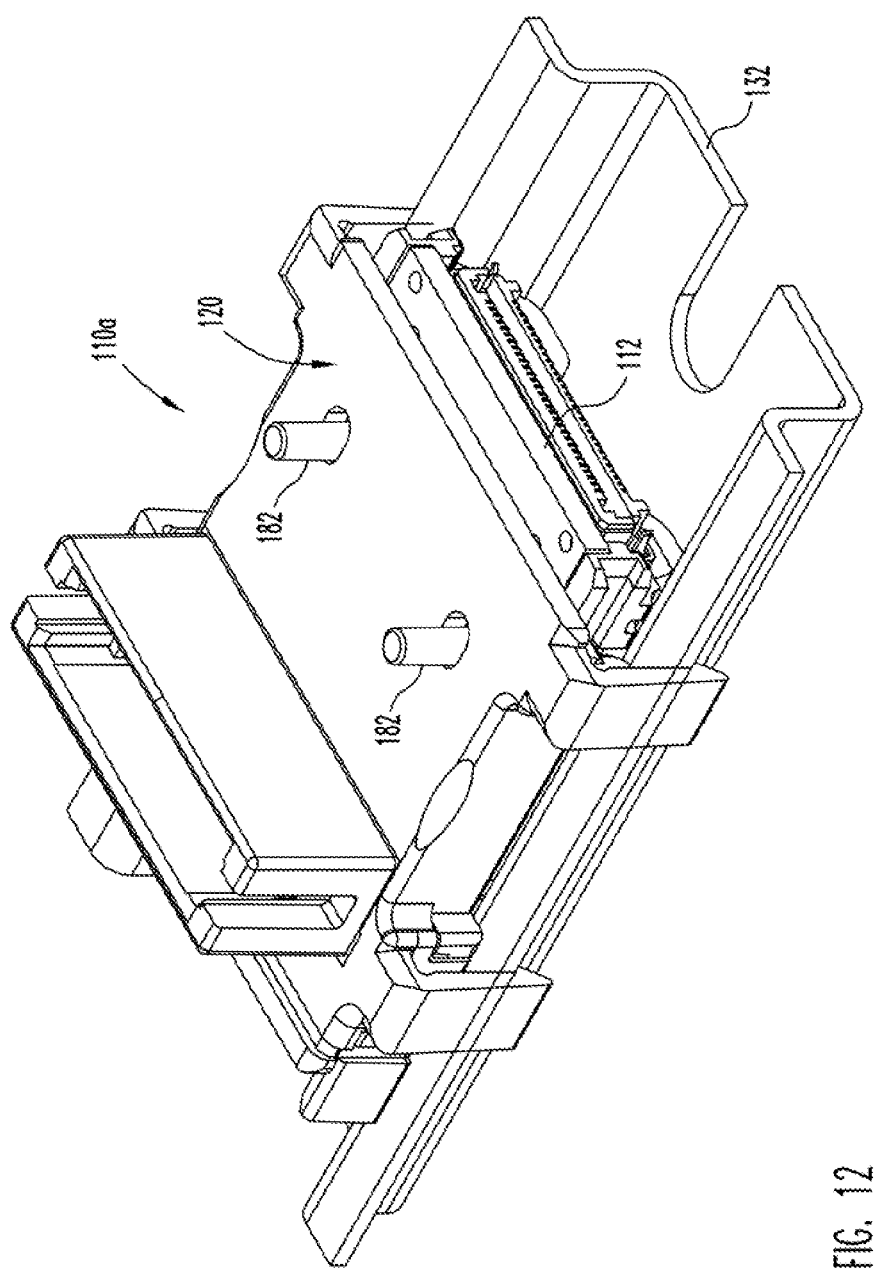
FIG. 12 is a perspective view of a backplane module having a second embodiment mechanical bypass switch assembly, the backplane module attached to a DIN rail.

FIGS. 9-11 illustrate the backplane module 110 with a function module 310 operatively attached to the backplane module 110. The function module includes a backplane electrical connector 312 that interconnects with the function module electrical connector 114 of the backplane module. To simplify the drawings, the electronic components of the function module other than the backplane electrical connector are omitted.

Attaching the function module to the backplane module drives the contact holder 162 from its closed position shown in FIG. 6 to its opened position shown in FIG. 11, thereby opening the bypass circuits 152a-152d. Later removal of the function module from the backplane module enables the spring assembly 174 to return the connector holder from its opened position back to its closed position, thereby closing the bypass circuits 152a-152d.

The backplane electrical connector 312 is located in a housing 314 of the function module 310. The function module housing has a flat bottom wall 316. The backplane electrical connector is aligned with an opening 318 in the bottom wall that is sized to closely receive the housing cover 146 when plugging the backplane electrical connector into the function module electrical connector. A lateral planar side wall 320 is located along one side of the opening and extends upwardly towards the backplane electrical connector. The side wall and the housing cover 146 cooperate with one another in guiding relative movement of the function module and maintaining alignment of the electrical connectors 114, 312 when attaching or detaching the electrical connectors.

The function module 310 also includes conventional features that resist further movement of the backplane electrical connector 312 towards the function module electrical connector 114 after the connectors are fully engaged with one another.

The function module bottom wall 316 includes a flat planar portion 322 that is parallel with the top cover planar portion 144 when the electrical connectors 114, 312 are being guided for attachment, are attached together, or are being detached from one another.

The actuators 182 are in the path of movement of the bottom wall portion 322 when connecting the electrical connectors 114, 312. As the electrical connector 312 first moves into the top cover receptacle portion 148, the bottom wall portion 322 engages and presses against the top surfaces 184 of the actuators 182. Continued attachment movement of the function module 310 causes the bottom wall portion 322 to push the actuators into the housing and push the contact member 162 away from its closed position towards its opened position.

When the electrical connectors 114, 312 are fully engaged and connected with one another as shown in FIG. 11, the contact holder 162 has been pushed by the function module 310 to the opened position as shown in the figure. The bypass switch circuits 152a-152d are now open circuits and the signal stream S extends through the function module 310 and not the bypass switch circuits.

Initial movement of the contact holder 162 away from its closed position does not open the bypass switch circuits 152a-152d. Elastic deformation of the spring arms maintains the contact noses 168 against the contact pads 156-158 during this initial movement. The contact noses exhibit lost motion in the direction of contact holder movement during the initial movement of the contact holder from the closed position towards the opened position (other embodiments of the bypass switch assembly may include effectively no lost motion of the contact noses with the contact member).

FIG. 6 illustrates the contact member 162 in its closed position but with a spring arm 164 in its unstressed, relaxed shape. The lost motion of the contact noses 168 of the contact member is equal to the elastic deformation of a contact nose from its unstressed position shown in FIG. 6 to its actual shape with the contact nose pressed against a contact pad 156 or contact pad 158.

In the illustrated embodiment the electrical connectors 114, 312 make electrical connections with one another before the spring arm contact noses 168 lose contact with the contact pads 156, 168. The function module electrical connector mechanically engages the backplane electrical connector 314 along an initial mechanical engagement distance 184 (see FIG. 11) before the electrical connectors 114, 314 electrically connect with one another. The function module electrical connector and the backplane electrical connector continue being electrically connected with one another as the function module electrical connector mechanically engages the backplane electrical connector along a secondary mechanical engagement distance 186 until the electrical connectors are fully mechanically engaged with one another.

The electrical connections between the function module electrical connector 114 and the backplane electrical connector 312 of the function module when attaching the function module to the function module electrical connector are made during the lost motion phase of contact holder movement away from the closed position. The electrical connection between the electrical connectors 114, 312 is made before the bypass switch assembly 152 opens so as to assure no loss of signal continuity when attaching a function module.

When the function module 310 is removed from the backplane module 110, the compression springs 176 urge the contact holder 162 back to its closed position. The contact noses 168 re-engage the contact pads 156, 158 before the contact holder reaches the closed position. The contact noses exhibit the same lost motion in the direction of contact holder movement during the final portion of movement of the contact holder from the opened position to the closed position. The electrical connection between the backplane module and the function module is broken during the lost motion phase of the contact noses as the contact holder moves to the closed position for no loss of signal continuity when removing a function module from the backplane module.

FIGS. 12-17 illustrate a second embodiment backplane module 110a. The backplane module 110a is similar to the backplane module 110 and so only differences will be discussed. The same reference numbers used in describing the first embodiment backplane module 110 will be used for corresponding elements of the second embodiment backplane module 110a.

In this embodiment the contact holder 162 of the bypass switch assembly 150 pivots about a pivot axis rather than translating when moving between opened and closed positions. A side of the contact holder is attached to a shaft 186 integrally formed with the contact holder. The shaft is rotatably mounted by snap or interference fits in spaced apart journals 188. The shaft is coaxial with the pivot axis and extends transverse to the DIN rail axis.

Figure 15:
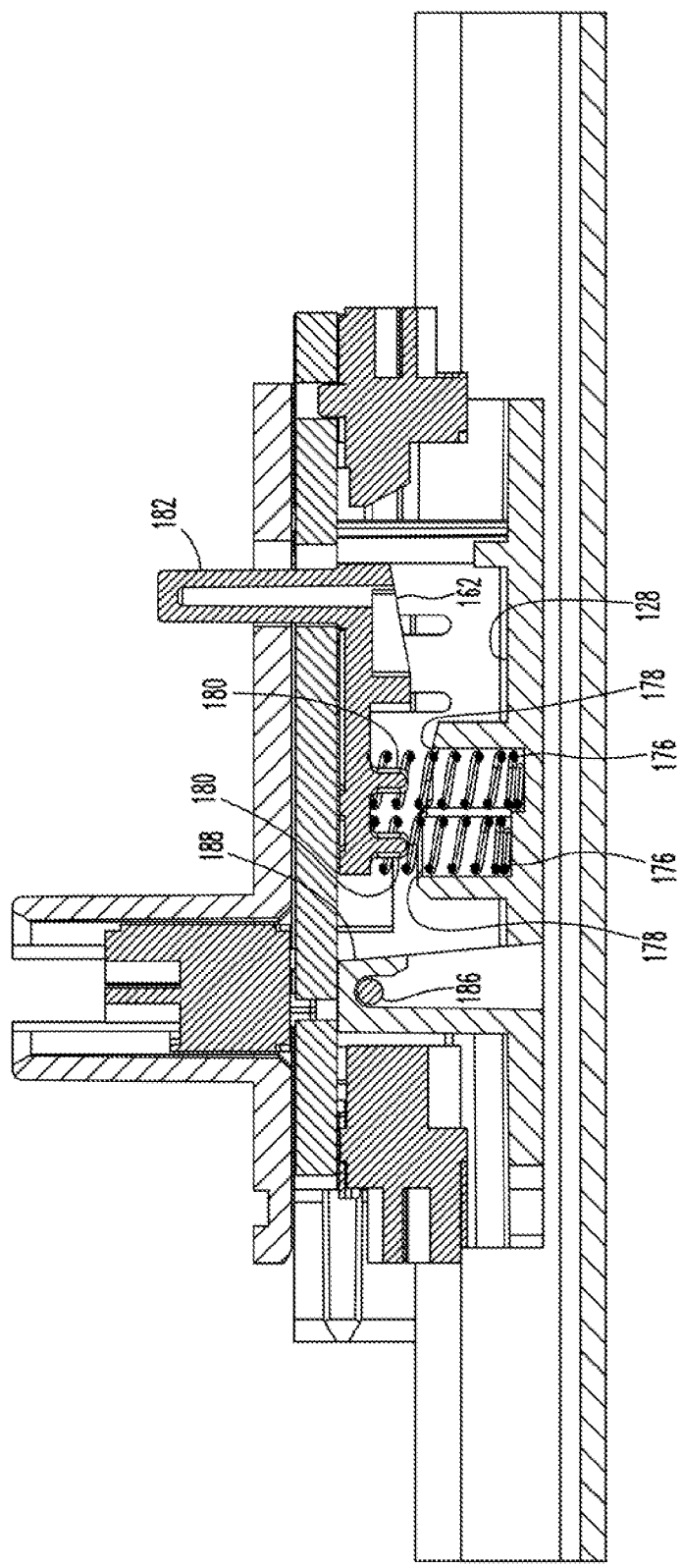
FIG. 15 is a sectional view taken along lines 15-15 of FIG. 13.
Figure 16:
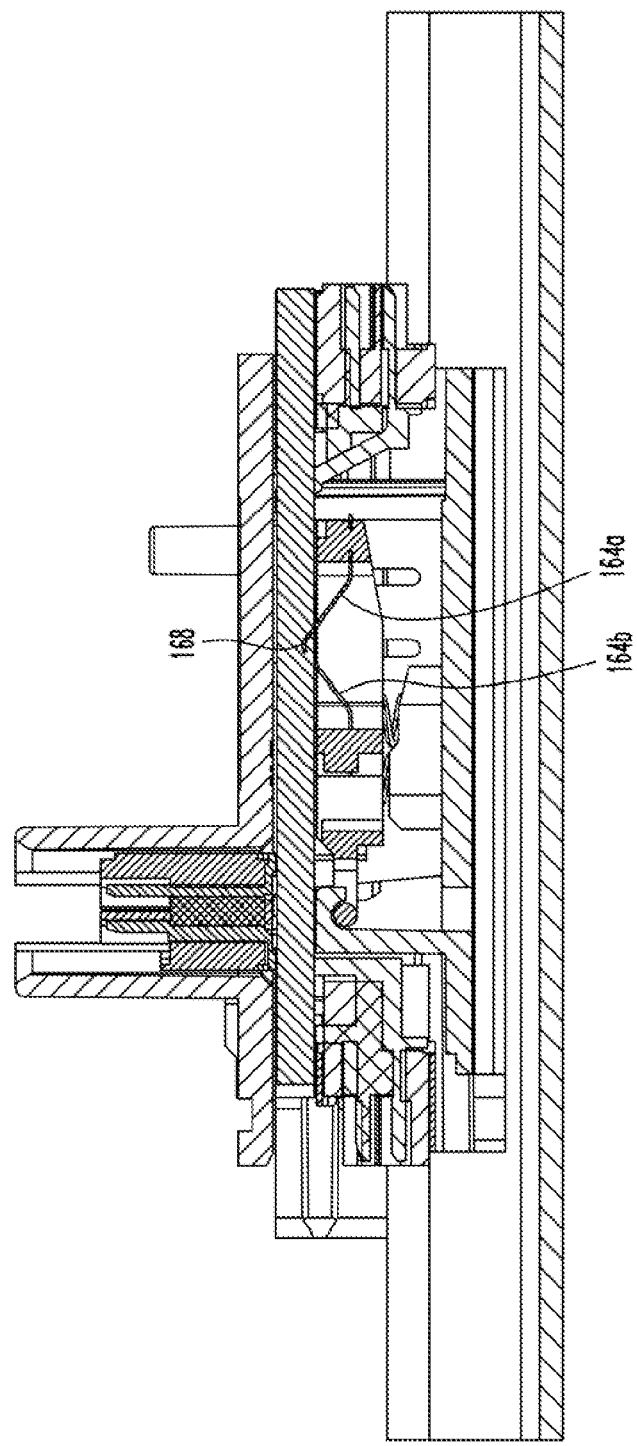
FIG. 16 is a sectional view taken along lines 16-16 of FIG. 13.
Figure 17:
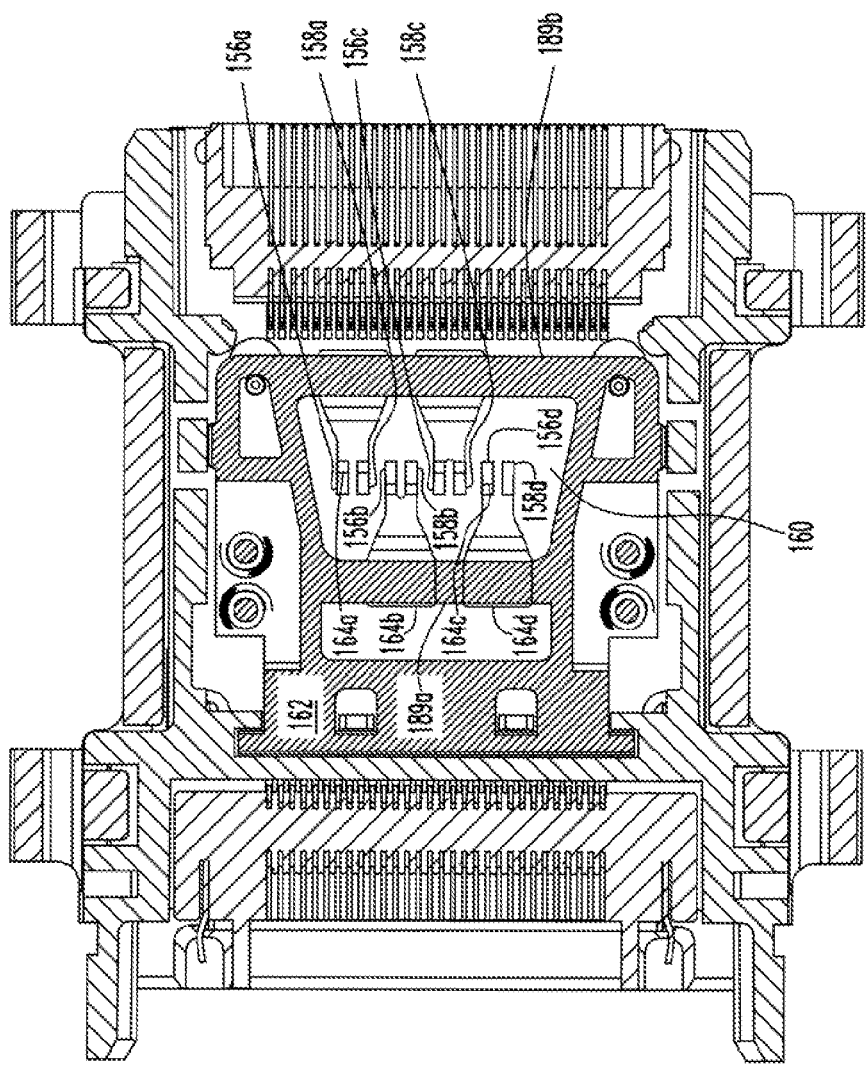
FIG. 17 is a sectional view taken along lines 17-17 of FIG. 14.

The shaft 186 permits the contact holder to pivot about the shaft axis and move from its closed position best seen in FIGS. 15 and 16 to its opened position (shown in FIG. 20).

The bypass circuit 152 is closed when the contact holder 162 is in the closed position. The bypass circuit is open when the contact holder is in the opened position.

The contact holder 162 has spaced-apart cross beams 189a, 189b parallel with the shaft 186. The cross beams are located on opposite sides of sets of contact pads 156, 158 located on the bottom surface 160 of the printed circuit board 112. Each cross beam carries a pair of spring contacts (164a, 164c) or spring contacts (164b, 164d). Each spring contact has a pair of bent spring arms 166 that extend are side-by-side with one another and a contact nose 168 on each spring arm. The contact noses 168 of each spring arm makes contact with a respective pair of contact pads 156, 158 to close the signal bypass circuit 152 associated with the pair of contact pads.

The spring assembly 174 includes pairs of compression springs 176 that apply torque to the contact holder 162 urging pivotal movement of the contact holder 162 towards the closed position. The lower ends of the compression springs are received in open-ended bores 178 defined by the housing lower wall 128. The upper ends of the compression springs surround protuberances 180 extending downwardly from the contact holder.

The actuators 182 are located along a side of the contact member away from the shaft and extend through the aligned through-openings in the printed circuit board and the housing top wall. The openings are sized to enable pivoting of the contact member without interference from the actuators rubbing on the sides of the openings.

FIGS. 12-17 illustrate the backplane module 110a without a function module attached to the function module electrical connector 114. The contact member 162 is in its closed position, the spring assembly 174 pressing the contact noses of the spring contacts against the contact pads. One of the spring arms is drawn in FIG. 15 in its unstressed, relaxed state to show the amount of lost pivotal motion of the contact noses (corresponding to the lost translation motion of the contact noses of the first embodiment backplane module 110) when the contact member pivots to or from the closed position.

Figure 19:
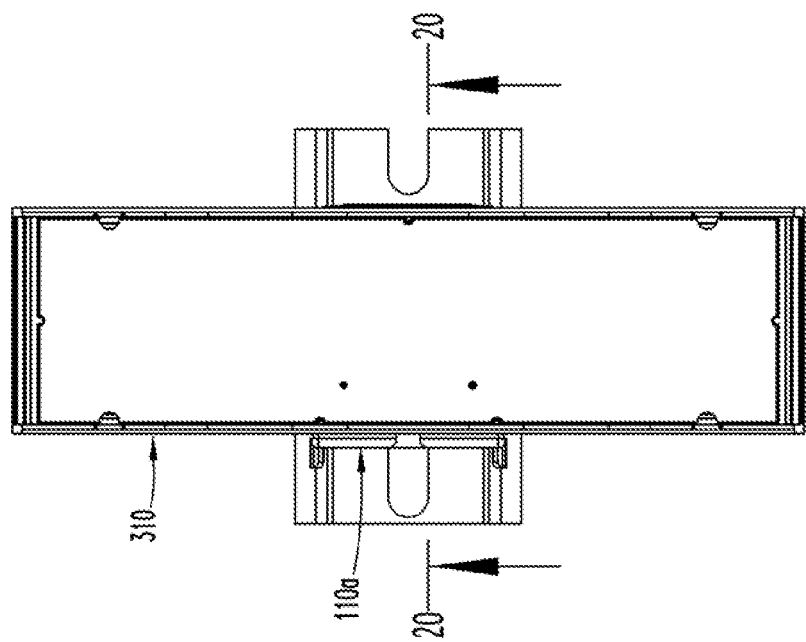
FIG. 19 is similar to FIG. 13 but with a function module attached to the backplane module.
Figure 18:
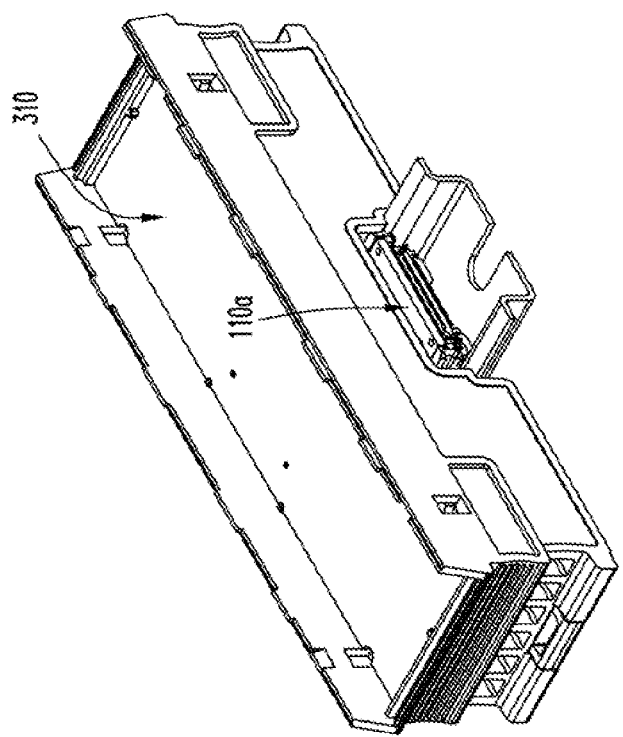
FIG. 18 is similar to FIG. 12 but with a function module attached to the backplane module.

FIGS. 18-20 illustrate the backplane module 110a with the function module 310 attached to the function module electrical connector 114. The function module bottom wall portion 322 has engaged the actuators 182 and caused the contact member 162 to pivot to the opened position. The bypass circuit 152 is now open and the signal stream S extends through the function module electrical connector 114 and the backplane electrical connector 312.

When the function module 310 is removed from the function module electrical connector 114, the springs 176 urge the contact member 162 back to its closed position, closing the bypass circuit 152. The signal path S extends through the bypass circuit and not through the function module electrical connector.

The lost motion of the contact noses enables the same "make before break" behavior of the electrical connectors 114, 312 and the bypass circuits 152 as previously described for the first embodiment backplane module 110 when attaching or detaching the function module to the backplane module 110a.

The signal break in the signal stream S caused by removing a function module from the network may differ in different network topologies.

For example, FIG. 27 illustrates a portion of an industrial control network 610 that includes a monolithic backplane 612. The backplane 612 defines a portion of an Ethernet ring network topology that transmits network data along the backplane while providing network redundancy in the event of a single signal break.

The backplane carries a head module 612 that communicates data between the backplane and a PLC (not shown) and a number of function modules 614 attached to function module electrical connectors (not shown) on the backplane. The function modules write and/or read data to or from the ring network. End modules 616, 618 close the ring topology at both ends of the backplane.

The backplane 612 and the end modules 616, 618 cooperatively define a ring network signal path S consisting of a pair of rings R1 and R2 that are each independently capable of transmitting data between the head module 612 and the function modules 614. The backplane 612 carries two sides of each of the rings R1 and R2 that are closed by the end modules.

If a single function module 614 is removed, the signal break caused by the removal opens the rings R1 and R2 as shown in FIG. 28. An Ethernet switch 620 in a function module adjacent to the signal break can transfer data from one ring to the other ring to maintain signal path continuity between the head module 612 and the attached function modules.

But should a pair of function modules 614 be removed from opposite sides of an attached module 614a as shown in FIG. 29, the signal path S is broken on both sides of the attached function module 614a. The function module 614a is stranded along the network and loses the ability to communicate with the head module 610 and the other function modules 614.

Figure 21:
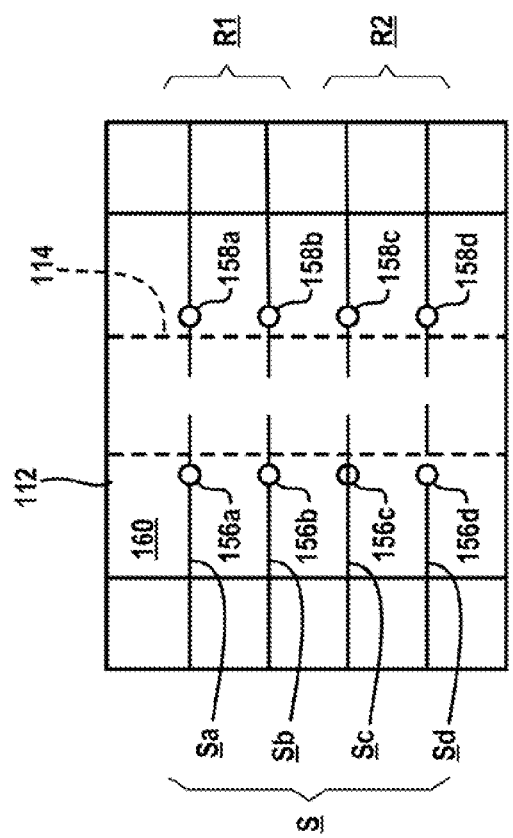
FIG. 21 is a view similar to FIG. 5 but with the bypass switch assembly being used in the ring topology network shown in FIGS. 25-27.
Figure 24:
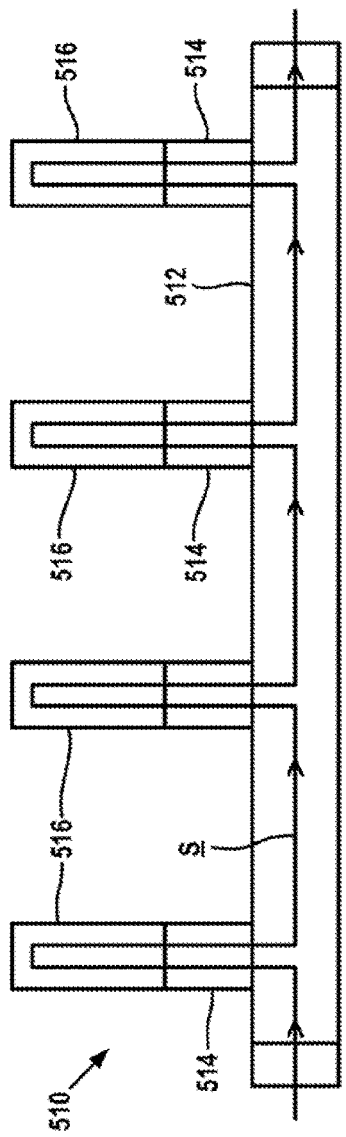
FIGS. 24-26 are schematic views of a prior art backplane defining a bus network topology and having software-controlled bypass switch assemblies.
Figure 25:
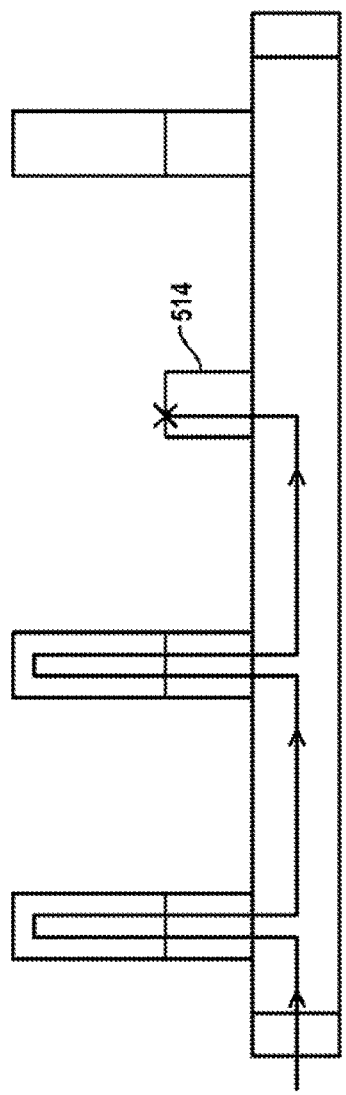
Figure 26:
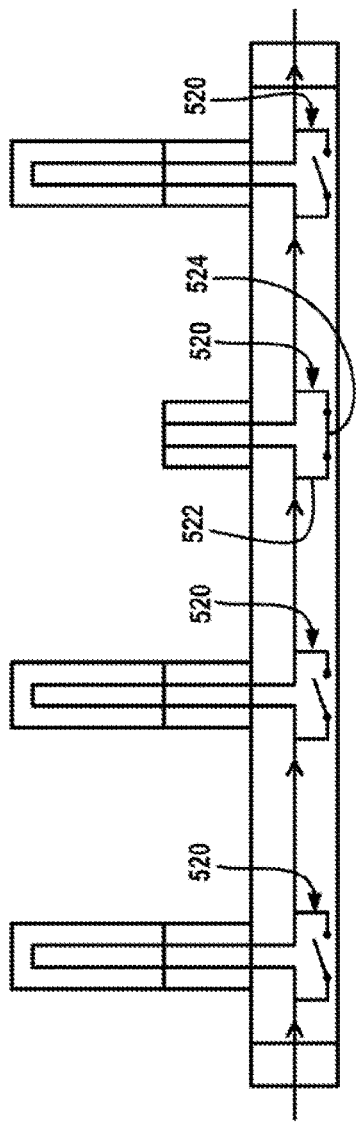

FIG. 21 schematically illustrates a printed circuit board 120 for a backplane module intended to form part of a modular backplane defining a two-ring Ethernet network of the type shown in FIGS. 25-27. The backplane module includes a backplane switch assembly 150 identical to the backplane switch assembly of the backplane module 110 or the backplane module 110a but intended to maintain signal continuity along the ring portions carried by the printed circuit board. To simplify the drawing only the portions of the backplane switch assembly on the printed circuit board 120 are shown in the figure.

The backplane module 110b is similar to the backplane modules 110, 110a but is intended to define and form part of the two-ring Ethernet network signal path S shown in FIGS. 25-27. The portions of the rings R1 and R2 carried by the printed circuit board 112 are defined by conductive paths Sa, Sb, Sc, Sd that correspond to the four wires of a conventional four-wire Ethernet cable.

When a function module 310 is not attached to the function module electrical connector 114, the backplane switch assembly 150 closes the rings R1, R2 and maintains signal continuity across the break in both rings caused by absence of the function module. When the function module is attached to the function module electrical connector the backplane switch assembly opens and the rings R1, R2 extend through the attached function module.

Each electrical contact 164 described above have a pair of contact noses 168 that make or break connections with a pair of contact terminals 156, 158 on the printed circuit board. An alternative electrical contact construction is shown in FIG. 22. An electrical contact 164', similar to an electrical contact 164, has one arm spring arm permanently attached to the printed circuit board and the other spring arm being a free arm with a contact nose 168. The contact nose 168 makes or breaks contact with a single contact terminal on the printed circuit board to close and open the bypass switch circuit associated with the electrical contact. The contact nose 168 can also be designed with lost motion as illustrated in the figure.

An actuator 182 in possible embodiments is provided with multiple actuator members. FIG. 23 illustrates an electrical contact 164 integrally attached to an actuator member 182' that are formed from a single stamping from a metal plate. Each electrical contact 164 of a multi-contact bypass switch assembly is in this embodiment integrally attached to a respective actuator member 182', the multiple actuator members forming the actuator. In the illustrated embodiment a compression spring 176' (drawn in FIG. 23 with phantom lines in simplified form) surrounds the actuator member 182' and is captured between the top cover 144 and an enlarged upper end of the actuator member. The spring urges the electrical contact towards its closed position.

The function modules 310 are intended to pass the signal stream S through the module. A "null module", however, can also be attached to either embodiment backplane module 110, 110a, or 110b. A null module mechanically mates with the function module electrical connector 114 or the housing receptacle 148 without forming electrical connections with the function module electrical connector. The null module would not include structure that engages the actuators 182 and so attachment of the null module does not open the bypass circuit 152. A null module may be used as a protective cover for the housing receptacle 148 or used for some other purpose when the bypass circuit should remain closed.

Other embodiments of the bypass switch assembly may include more or less pairs of contact pads depending on the conductive paths needed for the signal type being carried by the backplane module, and the contact pad arrangement may be different from those shown in the illustrated embodiments.

It is not necessary that the electrical contacts of a bypass switch assembly having two or more electrical contacts be identical with one another. If, for example, one of the electrical contacts transmits a high-frequency data signal, the one electrical contact may have features intended to minimize attenuation of the data signal transmitted through the contact, the other electrical contacts not including such features.

While this disclosure includes one or more illustrative embodiments described in detail, it is understood that the one or more embodiments are each capable of modification and that the scope of this disclosure is not limited to the precise details set forth herein but include such modifications that would be obvious to a person of ordinary skill in the relevant art including (but not limited to) changes in material selection, size, operating ranges (contact member travel, lost motion, and the like), environment of use, number and arrangement of contact pads, monolithic versus modular backplane construction, and the like, as well as such changes and alterations that fall within the purview of the following claims.

The invention claimed is:

1. A backplane or backplane module for transmitting data along a signal path of a network, the backplane or backplane module of the type being configured to attach a function module to the backplane or backplane module for connecting the function module to the signal path, the backplane or backplane module comprising:

a printed circuit board, a function module electrical connector capable of being removably electrically and mechanically connected to a function module for making electrical connections therebetween, and a bypass switch assembly;

the printed circuit board comprising a first side, an opposite second side separated from the first side by a thickness of the printed circuit board, and an electrically conductive network signal path;

the function module electrical connector being attached to the first side of the printed circuit board and comprising an electrically conductive signal path in series with the network signal path of the printed circuit board, the signal path having an open portion being disposed between first and second portions of the network signal path when no function module is connected to the function module electrical connector;

the bypass switch assembly comprising a bypass circuit and a mechanically operated switch assembly comprising an electrical contact and an actuator;

the bypass circuit forming a portion of the printed circuit board, the bypass circuit comprising an electrically conductive bypass signal path and first and second sets of electrical terminals, the bypass signal path being connected in series between the first and second portions of the network signal path, the bypass signal path extending in parallel across the open portion of the network signal path, the bypass signal path comprising a first portion connected to the first portion of the network signal path, a second portion connected to the second portion of the network signal path, and an open portion being disposed between the first and second portions of the bypass signal path;

the first portion of the bypass signal path comprising the first set of electrical terminals, the second portion of the bypass signal path comprising the second set of electrical terminals, the first and second sets of electrical terminals not in electrical continuity with one another;

the electrical contact being movable with respect to the printed circuit board between spaced-apart closed and opened positions, the electrical contact engaging at least one of the first and second sets of electrical terminals of the bypass circuit and closing the bypass signal path when the electrical contact is in the closed position, the electrical contact spaced apart from and not engaging the said at least one of the first and second sets of electrical terminals of the bypass circuit when the electrical contact is in the opened position;

the actuator being connected to the electrical contact and conjointly movable with the electrical contact, the actuator extending away from the first side of the printed circuit board to a free end of the actuator being disposed on the first side of the printed circuit board, the free end being spaced away from the printed circuit board when the electrical contact is in the closed position wherein a force applied to the free end of the actuator when the electrical contact is in the closed position urging the free end of the actuator towards the printed circuit board also urges the electrical contact towards the opened position of the electrical contact.

2. The backplane or backplane module of claim 1 wherein the mechanically operated switch assembly comprises a contact holder holding the electrical contact, the contact holder being made of an electrical insulator, the actuator rigidly attached to the contact holder.

3. The backplane or backplane module of claim 2 wherein the contact holder and the actuator are formed as a single-piece, integral member.

4. The backplane or backplane module of claim 1 wherein the electrical contact comprises a respective contact nose that engages the said at least one of the first and second sets of electrical terminals when the electrical contact is in the closed position, and the electrical contact moves a lost motion distance when moving from the closed position to the opened position before each respective contact nose disengages from the said at least one of the first and second sets of electrical terminals.

5. The backplane or backplane module of claim 4 wherein when attaching a function module to the function module electrical connector, the function module electrically connects with the function module electrical connector before each respective contact nose disengages from the said at least one of the first and second sets of electrical terminals.

6. The backplane or backplane module of claim 4 wherein when detaching a function module from the function module electrical connector, the function module electrically disconnects from the function module electrical connector after each respective contact nose engages with the said at least one of the first and second sets of electrical terminals.

7. The backplane or backplane module of claim 4 wherein each respective contact nose is disposed on a respective spring arm of the electrical contact, each spring arms elastically deflecting during the lost motion of the electrical contact.

8. The backplane or backplane module of claim 1 wherein when attaching a function module to the function module electrical connector, the function module electrically connects with the function module electrical connector after the electrical contact disengages from the said at least one of the first and second sets of electrical terminals.

9. The backplane or backplane module of claim 1 wherein when detaching a function module from the function module electrical connector, the function module electrically disconnects from the function module electrical connector before the electrical contact engages with the said at least one of the first and second sets of electrical terminals.

10. The backplane or backplane module of claim 1 comprising a cover overlaying at least a portion of the first side of the printed circuit board, the actuator extending through the cover.

11. The backplane or backplane module of claim 10 wherein the cover is a portion of a housing containing the first and second sets of contact terminals, the housing further comprising a plurality of spaced apart side walls and a lower wall, the lower wall being disposed on the second side of the printed circuit board, the side walls extending from the cover to the lower wall.

12. The backplane or backplane module of claim comprising a spring being disposed between the electrical contact and the lower wall of the housing, the spring urging movement of the electrical contact towards the closed position.

13. The backplane or backplane module of claim 12 comprising a contact holder holding the electrical contact and movable with the electrical contact terminal between opened and closed positions, the spring engaging the contact holder and the lower wall.

14. The backplane or backplane module of claim 13 comprising a guide wall extending along the path of movement of the electrical contact between opened and closed positions and a slot that closely receives the guide wall, the guide wall extending from one of the following (a) and (b) and the slot formed in the other of the following (a) and (b): (a) the contact holder and (b) one of the side walls of the housing.

15. The backplane or backplane module of claim 10 comprising cooperating latch members on the cover and the side walls that attach the cover and the side walls together.

16. The backplane or backplane module of claim 1 wherein the electrical contact translates with respect to the printed circuit board when moving between opened and closed positions.

17. The backplane or backplane module of claim 1 wherein the electrical contact pivots about an axis when moving between opened and closed positions.

18. The backplane or backplane module of claim 1 wherein the network signal path comprises a plurality of conductors that each independently transmit power and/or data, the first and second bypass signal path portions each comprise a plurality of conductors connected to corresponding conductors of the network signal path, the first and second sets of electrical terminals each comprise a plurality of electrical terminals, each electrical terminal connected to a respective conductor of the bypass signal path portions, and the bypass circuit switch comprises one or more additional electrical contacts, each electrical contact associated with a respective pair of electrical conductors of the bypass circuit switch portions and engageable and disengageable with at least one of the pair of first set and second set electrical terminals connected to the associated pair of electrical conductors.

19. The backplane or backplane module of claim wherein the network signal path comprises four conductive paths corresponding to the wires of a 4-wire Ethernet cable.

20. The backplane or backplane module of claim 19 wherein the four conductive paths define a portion of a ring network topology.

21. The backplane or backplane module of claim 1 wherein each electrical terminal is formed as a contact pad having a width dimension and a length dimension transverse to the width dimension.

22. The backplane or backplane module of claim 1 wherein the mechanically operated switch assembly comprises the electrical contact and one or more additional electrical contacts.

23. The backplane or backplane module of claim including a function module attached to the function module electrical connector and pressing against the actuator, the electrical contact in the opened position.

24. The backplane or backplane module of claim 1 wherein the first and second sets of electrical terminals are disposed on the second side of the printed circuit board.

25. The backplane or backplane module of claim 1 wherein the electrical contact is integral with the actuator.

26. The backplane or backplane module of claim 1 wherein the mechanically operated switch assembly comprises a plurality of electrical contacts, and the actuator comprises a plurality of actuator members, each actuator member connected to a respective electrical contact of the plurality of electrical contacts.

27. The backplane or backplane module of claim wherein the electrical contact is engageable with and disengageble from both the first set of electrical terminals and the second set of electrical terminals.

28. The backplane or backplane module of claim 1 wherein the first and second sets of electrical terminals and the mechanically operated switch assembly are disposed on the second side of the printed circuit board.

* * * * *

UNITED STATES PATENT AND TRADEMARK OFFICE
CERTIFICATE OF CORRECTION

PATENT NO. : 10,842,039 B1
APPLICATION NO. : 16/645606
DATED : November 17, 2020
INVENTOR(S) : Scott Michael Frye et al.

Page 1 of 1

It is certified that error appears in the above-identified patent and that said Letters Patent is hereby corrected as shown below:

On the Title Page

Item [72] Inventors:
Second line, change "Brian John Gillespie, Jr." to --Brian John Gillespie--.

Signed and Sealed this
Nineteenth Day of January, 2021

Andrei Iancu
*Director of the United States Patent and Trademark Office*